(12) United States Patent
Eom

(10) Patent No.: US 12,066,176 B2
(45) Date of Patent: Aug. 20, 2024

(54) LIGHTING MODULE AND LIGHTING DEVICE COMPRISING SAME

(71) Applicant: LG INNOTEK CO., LTD., Seoul (KR)

(72) Inventor: Dong Il Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/909,789

(22) PCT Filed: Mar. 8, 2021

(86) PCT No.: PCT/KR2021/002850
§ 371 (c)(1),
(2) Date: Sep. 7, 2022

(87) PCT Pub. No.: WO2021/182825
PCT Pub. Date: Sep. 16, 2021

(65) Prior Publication Data
US 2024/0210026 A1    Jun. 27, 2024

(30) Foreign Application Priority Data
Mar. 9, 2020 (KR) .................. 10-2020-0029181

(51) Int. Cl.
*F21V 31/04* (2006.01)
*F21S 43/14* (2018.01)
(Continued)

(52) U.S. Cl.
CPC .............. *F21V 31/04* (2013.01); *F21S 43/14* (2018.01); *F21S 43/26* (2018.01); *F21S 43/31* (2018.01)

(58) Field of Classification Search
CPC . F21S 43/14; F21S 43/31; F21S 43/26; F21V 31/04
See application file for complete search history.

(56) References Cited

U.S. PATENT DOCUMENTS

| 7,922,375 B2 * | 4/2011 | Tatsukawa | ............ F21S 41/322 |
| | | | 362/302 |
| 2004/0136197 A1 * | 7/2004 | Ishida | .................. F21S 41/155 |
| | | | 257/E33.059 |

(Continued)

FOREIGN PATENT DOCUMENTS

| JP | 2007-300138 | 11/2007 |
| KR | 10-2009-0126190 | 12/2009 |

(Continued)

OTHER PUBLICATIONS

International Search Report dated Jun. 30, 2021 issued in Application No. PCT/KR2021/002850.

*Primary Examiner* — Matthew J. Peerce
(74) *Attorney, Agent, or Firm* — KED & ASSOCIATES, LLP

(57) ABSTRACT

A lighting module disclosed in an embodiment of the invention includes a circuit board; a plurality of light emitting devices arranged in a first direction on the circuit board; a resin layer sealing the plurality of light emitting devices; and a reflective member disposed on a surface of the resin layer and having an opening portion on one side, wherein the resin layer includes: an exit surface portion on which the opening portion is disposed; a curved surface portion opposite to the exit surface portion; and an upper surface portion disposed on the curved surface portion and the exit surface portion, wherein the light emitting device overlaps the curved surface portion in a vertical direction, the upper surface portion of the resin portion has a horizontal plane, and the width of the opening portion in the vertical direction is smaller than a height in a vertical direction of the exit surface portion, and the light emitting device may be disposed closer to a lower end of the curved surface portion than to a lower end of the exit surface portion.

20 Claims, 8 Drawing Sheets

(51) Int. Cl.
*F21S 43/20* (2018.01)
*F21S 43/31* (2018.01)

(56) References Cited

U.S. PATENT DOCUMENTS

| | | |
|---|---|---|
| 2009/0296418 A1 | 12/2009 | Luo et al. |
| 2015/0292703 A1 | 10/2015 | Yang et al. |
| 2016/0131336 A1* | 5/2016 | Kim .................... H01L 33/60 362/84 |
| 2017/0255005 A1 | 9/2017 | Tanitsu |
| 2019/0097094 A1 | 3/2019 | Han et al. |

FOREIGN PATENT DOCUMENTS

| | | |
|---|---|---|
| KR | 10-2010-0095566 | 8/2010 |
| KR | 10-2014-0061574 | 5/2014 |
| KR | 10-1551079 | 9/2015 |
| KR | 10-2019-0035491 | 4/2019 |
| KR | 10-2019-0087014 | 7/2019 |

\* cited by examiner

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2021/002850, filed Mar. 8, 2021, which claims priority to Korean Patent Application No. 10-2020-0029181, filed Mar. 9, 2020, whose entire disclosures are hereby incorporated by reference.

TECHNICAL FIELD

An embodiment of the invention relates to a lighting module that illuminates a surface light in a lateral direction. An embodiment of the invention relates to a lighting device having a lighting module, a light unit, or a vehicle lamp.

BACKGROUND ART

Light emitting diodes (LEDs) have advantages such as low power consumption, semi-permanent lifespan, fast response speed, safety, and environmental friendliness compared to conventional light sources such as fluorescent lamps and incandescent lamps. Such light emitting diodes are being applied to various lighting devices such as various display devices, indoor lights or outdoor lights. Recently, as a light source for a vehicle, a lamp employing a light emitting diode has been proposed. Compared with an incandescent lamp, a light emitting diode is advantageous in that power consumption is small. In addition, since the light emitting diode is small in size, it can increase the design freedom of the lamp, and it is also economical due to its semi-permanent lifespan.

DISCLOSURE

Technical Problem

An embodiment of the invention may provide a lighting module capable of improving the luminous intensity and condensing efficiency of light emitted to one side. An embodiment of the invention provides a lighting module that provides one or a plurality of surface lights in one side. An embodiment of the invention may provide a lighting module for illuminating surface light, and a lighting device having the same, a light unit, a liquid crystal display device, or a vehicle lamp.

Technical Solution

A lighting module according to an embodiment of the invention includes a circuit board; a plurality of light emitting devices arranged in a first direction on the circuit board; a resin layer sealing the plurality of light emitting devices; and a reflective member disposed on a surface of the resin layer and having an opening portion on one side of the resin layer, wherein the resin layer includes: an exit surface portion on which the opening portion is disposed; a curved surface portion opposite to the exit surface portion; and an upper surface portion disposed on the curved surface portion and the exit surface portion, wherein the light emitting device overlaps the curved surface portion in a vertical direction, and the light emitting device overlaps in a horizontal direction with a portion of the reflective member disposed on the exit surface portion, wherein the upper surface portion of the resin layer has a horizontal plane, a vertical width of the opening portion is smaller than a vertical height of the exit surface portion, and the light emitting device may be disposed closer to an lower end of the curved surface portion than a lower end of the exit surface portion.

According to an embodiment of the invention, the reflective member includes a first reflective portion disposed on the curved surface portion of the resin layer, a second reflective portion disposed on the first upper surface portion, and a third reflective portion disposed on the exit surface portion and having the opening portion. The third reflective portion may be disposed under the exit surface portion, and a height of an upper end of the third reflective portion may be disposed higher than a height of an upper end of the light emitting device. The curved surface portion or the first reflective portion may have a parabolic shape. A reflective layer may be included between the resin layer and the circuit board, and a diffusion layer disposed on the exit surface portion may be included.

According to an embodiment of the invention, a reflector is disposed between the light emitting device and the exit surface portion, and the upper end of the reflector may be higher than the upper surface of the light emitting device and less than or equal to 50% of the maximum thickness of the resin layer. A distance between the exit surface portion and the light emitting device may be greater than a distance between the reflector and the light emitting device.

A lighting module according to an embodiment of the invention includes a circuit board; a plurality of light emitting devices arranged in a first direction on the circuit board; a resin layer sealing the plurality of light emitting devices; and a reflective member disposed on a surface of the resin layer and having an opening portion on one side, wherein the light emitting device includes a plurality of first light emitting devices disposed in a first row, and a plurality of second light emitting devices disposed in a second row, wherein the resin layer includes a first resin portion sealing the first light emitting device and providing a first exit surface portion, and a second resin portion sealing the second light emitting device and providing a second exit surface portion, wherein the reflective member includes a first reflective member having a first opening portion on the first exit surface portion and disposed on the first resin portion, and a second reflective member providing a second opening portion on the second exit surface portion and disposed between the first and second resin portions.

According to an embodiment of the invention, the first resin portion includes a first curved surface portion opposite to the second exit surface portion, and a first upper surface portion disposed on the first curved surface portion and the first exit surface portion, the second resin portion includes a second curved surface portion opposite to the second exit surface portion, and a second upper surface portion disposed on an upper portion of the second curved surface portion and the second exit surface portion, and a portion of the reflective member may be disposed on at least a portion of the first exit surface portion and the second exit surface portion.

According to an embodiment of the invention, the first light emitting device overlaps the first curved surface portion in a vertical direction, the first and second upper surface portions have a horizontal plane, and the first light emitting device may be disposed closer to a lower end of the first curved portion than to a lower end of the first exit surface portion. The second exit surface portion may be disposed on an upper portion of the first emission surface portion. A diffusion layer disposed on at least one of the first and second exit surface portions may be included.

Advantageous Effects

According to an embodiment of the invention, it is possible to improve the luminous intensity and light collection efficiency in the lighting module. According to an embodiment of the invention, it is possible to provide a lighting module suitable for the central luminous intensity of the daytime running lamp, and it is possible to improve the light extraction efficiency of the lighting module.

It is possible to improve the optical reliability of the lighting module and the lighting device having the same according to an embodiment of the invention. Also, the invention may be applied to a vehicle lighting device having a lighting module, a light unit, various types of display devices, a surface light source lighting device, or a vehicle lamp.

BEST MODE

Figure 1:
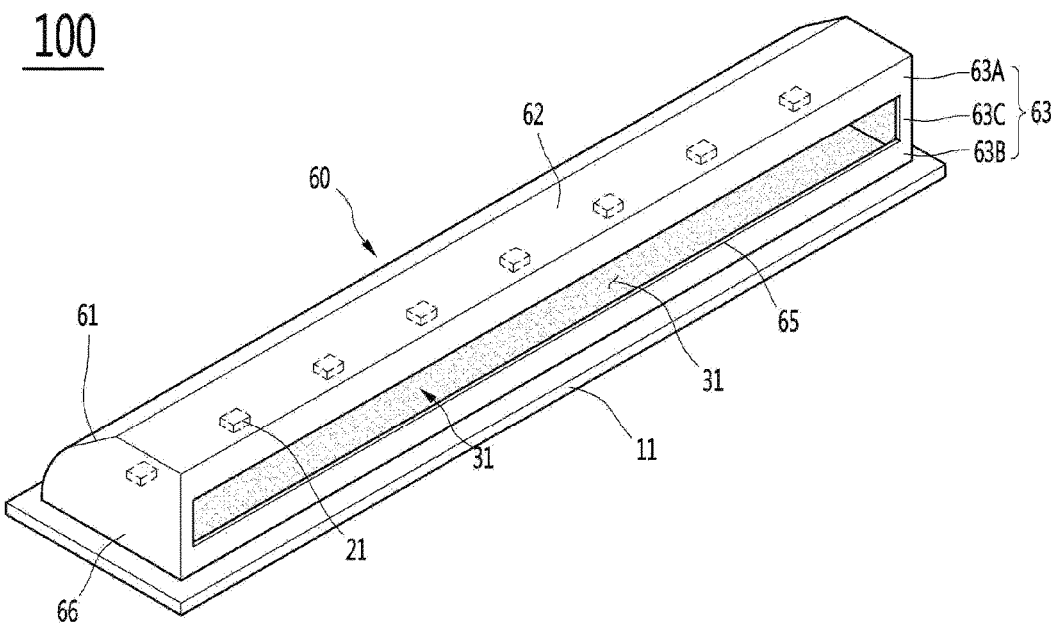
FIG. 1 is a perspective view showing a lighting module according to a first embodiment of the invention.

Hereinafter, preferred embodiments of the invention will be described in detail with reference to the accompanying drawings. The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components.

In addition, when expressed as "above (on)" or "below (under)", it may refer to a downward direction as well as an upward direction with respect to one element. The lighting device according to the invention may be applied to various lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

First Embodiment

Figure 2:
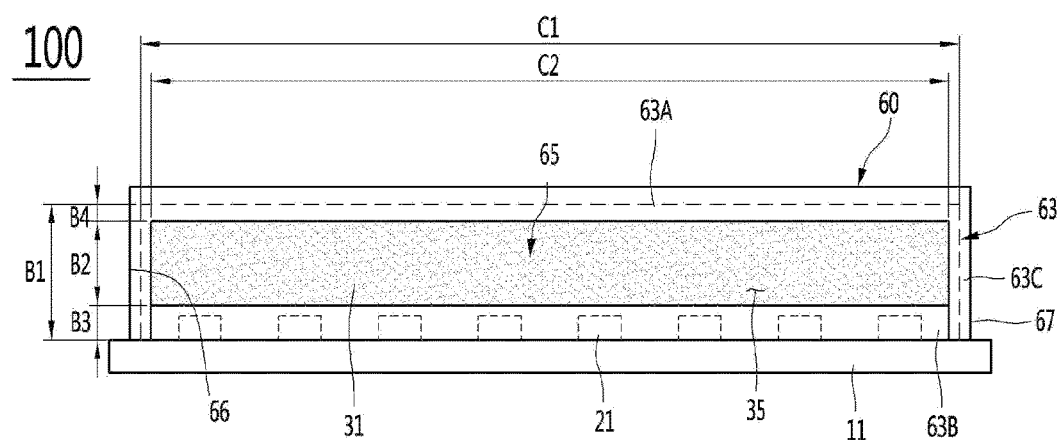
FIG. 2 is an example of a front view of the lighting module of FIG. 1.
Figure 3:
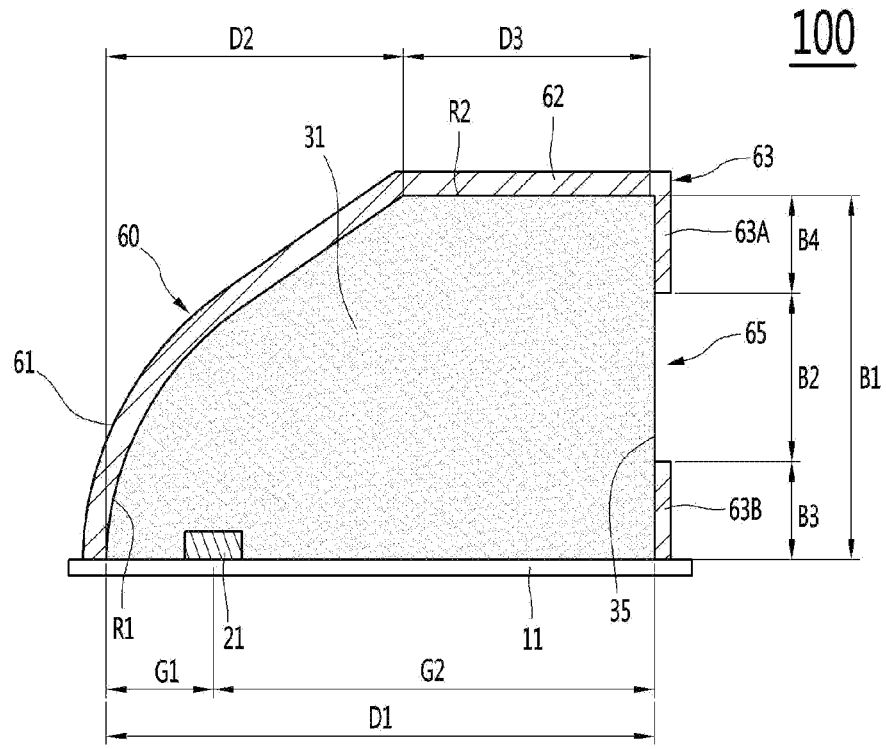
FIG. 3 is an example of a cross-sectional side view of the lighting module of FIGS. 1 and 2.

FIG. 1 is a perspective view showing a lighting module according to a first embodiment of the invention, FIG. 2 is an example of a front view of the lighting module of FIG. 1, FIG. 3 is an example of a side cross-sectional view of the lighting module of FIGS. 1 and 2, FIGS. 4 to 6 are modified examples of the lighting module of FIG. 3.

Referring to FIGS. 1 to 3, a lighting module 100 according to an embodiment of the invention includes a circuit board 11, a light emitting device 21 disposed on the circuit board 11, and a resin layer 31 sealing the light emitting device 21 disposed on the upper surface the circuit board 11, a reflective member 60 disposed on the upper surface and a plurality of side surfaces of the resin layer 31, and an open opening portion 65 which is open to at least a portion of one side of the reflective member 60. The opening portion 65 may be a region in which a portion of the resin layer 31 is exposed or another light-transmitting member is exposed.

The light emitting devices 21 may be arranged in at least one row on the circuit board 11. The light emitting devices 21 may emit light of the same color, or at least two or more may emit light of different colors. The color(s) of the light emitted from the light emitting device 21 may emit light in at least one or two or more of blue, green, red, and yellow. The lighting module 100 may emit the light emitted from the light emitting device 21 as surface light. The lighting module 100 may illuminate the surface light emitted from the light emitting device 21 in a side view type. Since the lighting module 100 is provided as a side-type surface light, it is possible to block the occurrence of hot spots, and to improve light collection efficiency and luminous intensity. The thickness of the lighting module 100 may be in the range of 10 mm or more from the bottom of the circuit board 11, in the range of 10 mm to 20 mm, or in the range of 10 mm to 15 mm. The thickness of the lighting module 100 may be a linear distance between the lower surface of the circuit board 11 and the uppermost surface of the reflective member 60. The lighting module 100 may be provided with a thickness of less than 20 mm, and in such a thin thickness, surface light may be emitted in the form of a line, and directivity characteristics may be wide.

In the lighting module 100, the circuit board 11 may function as a base member or a support member positioned under the light emitting device 21, the resin layer 31, and the reflective member 60. The circuit board 11 includes a printed circuit board (PCB). The circuit board 11 may include, for example, at least one of a resin-based printed circuit board (PCB), a metal core PCB, a flexible PCB, a ceramic PCB, or an FR-4 board. The circuit board 11 may include, for example, a flexible PCB or a rigid PCB. The circuit board 11 may have a long length in one direction, and a width in a direction perpendicular to the length direction may be smaller than the length.

Figure 4:
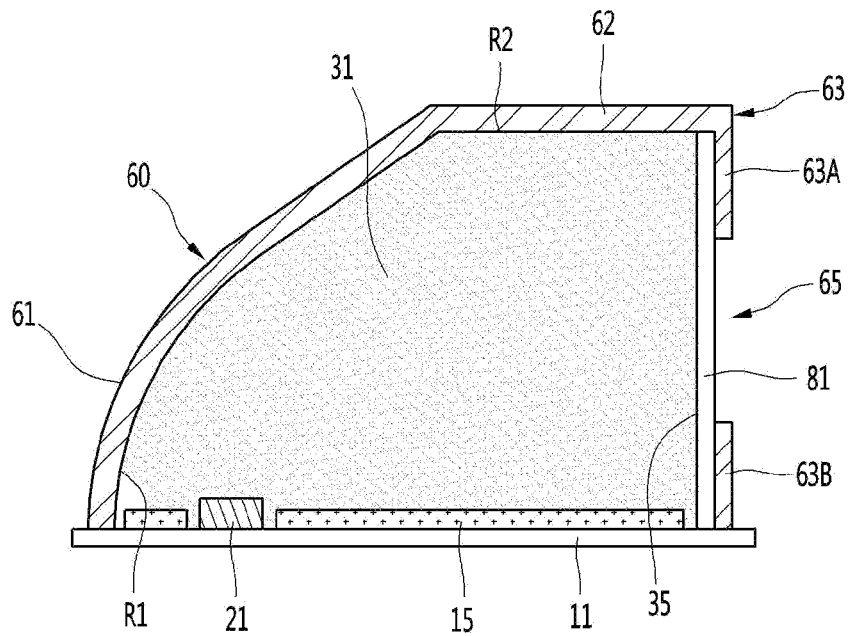
FIGS. 4 to 6 are modified examples of the lighting module of FIG. 3.

The circuit board 11 may include a wiring layer (not shown) thereon, and the wiring layer may be electrically connected to the light emitting device 21. A reflective material or a protective layer disposed on the circuit board 11 may protect the wiring layer. The light emitting devices 21 may be connected in series, parallel, or series-parallel by a wiring layer of the circuit board 11. In the plurality of light emitting devices 21, groups having two or more may be connected in series or in parallel, or between the groups may be connected in series or in parallel. The protective layer may include a member having a solder resist material, and the solder resist material is a white material and may reflect incident light. The thickness of the circuit board 11 may be 0.5 mm or less, for example, in the range of 0.3 mm to 0.5 mm. Since the thickness of the circuit board 11 is provided thin, the thickness of the lighting module 100 may not be increased. Since the circuit board 11 has a thickness of 0.5 mm or less, it may support a flexible module. A resin layer 31 may be formed on the circuit board 11, or a resin layer 31 may be formed on the circuit board 11 on which a reflective material layer or member is formed. As shown in FIG. 4, the lighting module 100 may include a reflective layer 15 disposed on the upper surface of the circuit board 11. The reflective layer 15 may reflect light traveling to the upper surface of the circuit board 11. The reflective layer 15 may be attached to the upper surface of the circuit board 11, or may be disposed between the circuit board 11 and the resin layer 31. An adhesive layer, for example, a material such as UV adhesive, silicone, or epoxy, may be formed between the reflective layer 15 and the circuit board 11. The reflective layer 15 may be provided as a film made of any one of a resin material, transparent PET, white polyethylene terephthalate (PET), and an Ag sheet. A reflective dot may be disposed on the reflective layer 15 to reflect incident light. The reflective dots may include ink, for example, may be printed on a material including any one of $TiO_2$, $CaCO_3$, $BaSO_4$, $Al_2O_3$, Silicon, and PS. Here, the reflective layer 15 has an open region, and the light emitting device 21 may be disposed through the open region. The reflective layer 15 may be formed on the entire upper surface of the circuit board 11, or may be disposed under the region of the resin layer 31 of the circuit board 11. As another example, the circuit board 11 may include a transparent material. When the circuit board 11 made of the transparent material is provided, light emitted from the light emitting device 21 may be emitted in a direction of an upper surface and in a direction of a lower surface of the circuit board 11.

The light emitting devices 21 may be arranged in at least one row on the circuit board 11. As another example, the light emitting device 21 may be arranged in a plurality of rows and/or columns. The light emitting device 21 may vertically overlap the resin layer 31 and the reflective member 60. The light emitting device 21 may be disposed in the resin layer 31 or may be sealed in the resin layer 31. The light emitting device 21 may be implemented as a light emitting chip that emits light, that is, an LED, or may include a light emitting chip and a wavelength conversion layer covering the light emitting chip. A plurality of pads may be exposed at a lower portion of the light emitting device 21, and light may be emitted through an upper surface and a side surface. The wavelength conversion layer converts some light emitted from the light emitting chip to a wavelength. The light emitting chip may be provided as a blue LED chip. The light emitting chip may be provided in the form of a flip chip, a vertical chip or a horizontal chip. The wavelength conversion layer may include at least one or two or more of red, yellow, and green phosphors. The wavelength conversion layer may have a thickness of 200 μm or less, for example, in a range of 100 to 200 μm. The thickness of the light emitting chip may be 0.3 mm or less. As another example, at least one or two or more of the light emitting devices 21 may emit light having the same or different wavelengths.

At least one layer or two or more layers of a resin material disposed on the circuit board 11 may be disposed. The resin layer 31 is disposed on the light emitting device 21, and may be made of a transparent resin material, for example, a resin material such as UV (ultra violet) resin, silicone, or epoxy. The resin layer 31 may be a layer containing or not containing a diffusion agent. The resin layer 31 may be disposed to have a long length in one direction, and the width of the lower surface may be smaller than the length, for example, may be 50% or less of the length. The circuit board 11 and the resin layer 31 may be provided in a straight shape, or a part or the whole in the longitudinal direction may have a curved shape. As shown in FIG. 3, the resin layer 31 may have an upper surface width D3 smaller than a lower surface width D1. The lower surface width D1 of the resin layer 31 may be the maximum distance from one side surface to the opposite side surface of the resin layer 31, and the upper surface width D3 may be a distance from the upper end of one side surface to the upper end of the opposite side surface extending horizontally. The one end on the lower surface and one end on the upper surface of the resin layer 31 may be disposed on the same straight line, and the other end on the lower surface may be disposed farther away from the one side surface of the resin layer 31 than the other end on the upper surface. The width D3 of the upper surface of the resin layer 31 may be 90% or less of the width D1 of the lower surface, for example, in the range of 40% to 90%, or in the range of 50% to 80%. Since the width D3 of the upper surface of the resin layer 31 is provided to be narrower than the width D1 of the lower surface, light may be guided in the direction of the opening portion 65. The resin layer 31 may include a curved surface portion R1 and an upper surface portion R2. The curved surface portion R1 may have a predetermined curvature and may extend from the other end of the lower surface of the resin layer 31 to the other end of the upper surface portion R2. A lower end of the curved surface portion R1 may be adjacent to the light emitting device 21. That is, the light emitting device 21 may be disposed at a position closer to the other end than the lower end of the resin layer 31. The curved surface portion R1 may be formed in a parabolic shape. The light emitting device 21 may be disposed at a position overlapping the curved surface portion R1 in a vertical direction. A center region between an upper end and a lower end of the curved surface portion R1 may overlap the opening portion 65 in a horizontal direction. The distance G1 between the lower end or the other end of the lower surface of the curved surface portion R1 from the center of the light emitting device 21 is 9% or more, for example, in a range of 9% to 15% or in a range of 9% to 13% of the lower surface width D1 of the resin layer 31. The distance G1 from the center of the light emitting device 21 to the other end of the lower surface of the resin layer 31 may be ⅕ or less, for example, in a range of ⅕ to ⅛ compared to the distance G2 from the lower end of the resin layer 31. The distance G1 may be 2.5 mm or less, for example, in the range of 1.8 mm to 2.5 mm or in the range of 1.8 to 2.3 mm. When the distance G1 is narrower than the above range, light extraction efficiency may be reduced, and when larger than the above range, light extraction efficiency may be decreased or a module width may be increased. Here, the width of the lower surface of the resin layer 31 may be the first distance D1, and the distance or minimum distance between a straight line perpendicular to the lower end of the curved surface portion R1 of the resin layer 31 and the upper end of the curved surface portion R1 may be the second distance D2, and the width of the upper surface portion R2 of the resin layer 31 may be the third distance D3. The distance G1 from the center of the light emitting device 21 to the lower end of the curved surface portion R1 may be 0.5 or less of the second distance D2, for example, in the range of 0.2 to 0.4 or 0.2 to 0.35 of the second distance D2. The second distance D2 may be smaller than the third distance D3. The second distance D2 may be 1.2 or more of the third distance D3, for example, in the range of 1.2 to 2 or in the range of 1.2 to 1.5 of the third distance D3. Since the second distance D2 is arranged to be smaller than the third distance D3, the reflection efficiency may be improved by the area and curvature of the curved surface portion R1. The first distance D1 may be 15 mm or more, for example, a range of 15 mm to 25 mm or a range of 15 mm to 20 mm.

The upper surface portion R2 of the resin layer 31 may be provided as a flat surface. In the resin layer 31, the area of the upper surface portion R2 may be smaller than the area of the lower surface. The resin layer 31 may include an exit surface portion 35. The exit surface portion 35 may be a surface facing the opening portion 65 or a surface on which the opening portion 65 is formed. The exit surface portion 35 may extend vertically from one end of the lower surface of the resin layer 31 to one end of the upper surface portion R2. A surface of the exit surface portion 35 opposite to the opening portion 65 may be flat. As another example, the surface of the exit surface portion 35 opposite to the opening portion 65 may be a flat surface, and the other surface may be a curved surface, an inclined surface, or a stepped portion. The maximum thickness B1 of the resin layer 31 may be 8 mm or more, for example, in the range of 8 mm to 15 mm or in the range of 8 mm to 13 mm. Accordingly, the reflective member 60 may be formed or the housing may be formed on the outside of the exit surface portion 35 of the resin layer 31, and the light may be condensed through the opening portion 65 or provided with high brightness.

The reflective member 60 may be formed on the curved surface portion R1, the upper surface portion R2, both sides in the longitudinal direction of the resin layer 31, and the outside of the exit surface portion 35 disposed in a region other than the opening portion 65. A lower portion of the reflective member 60 may be in contact with the upper surface of the circuit board 11 or may be in contact with the reflective layer 15 in the structures of FIGS. 4 and 5. The reflective member 60 may be formed of a reflective member made of a metal or non-metal material on the surface of the resin layer 31. The metal material may be formed of a material such as aluminum or silver. The non-metallic material may be provided as at least one of a resin material, a transparent PET, and a white polyethylene terephthalate (PET) material. The reflective member 60 may include any one of $TiO_2$, $CaCO_3$, $BaSO_4$, $Al_2O_3$, Silicon, and PS inside the resin. The thickness of the reflective member 60 may be formed to have a light reflectance of 85% or more, for example, 90% or more. The reflective member 60 includes a first reflective portion 61 disposed on the curved surface portion R1 of the resin layer 31 and a second reflective portion 62 disposed on the upper surface R2 of the resin layer 31, and a third reflective portion 63 disposed on the exit surface portion 35 of the resin layer 31. The first reflective portion 61 may be formed on the entire surface of the curved surface portion R1. The second reflective portion 62 may extend from the first reflective portion 61 and may be formed on the entire surface of the upper surface portion R2. The third reflective portion 63 may be formed on the entire surface of the exit surface portion 35 except for the opening portion 65. The third reflective portion 63 may include a first portion 63A extending from the second reflective portion 62 to an upper portion of the exit surface portion 35, and a second portion 63B disposed under the exit surface portion 35. The opening portion 65 may be disposed between the first portion 63A and the second portion 63B. The first portion 63A and the second portion 63B may be formed on the exit surface portion 35 of the resin layer 31. In the vertical direction, a height B4 of the first portion 63A of the third reflective portion 63 and a height B3 of the second portion 63B may have the same height or may have a difference of 10% or less. The sum B4+B3 of the heights of the first portion 63A and the second portion 63B is equal to the width B2 of the opening portion 65 or may be disposed in the range of 40% to 60% of the width B2 of the opening portion 65. That is, the width B2 of the opening portion 65 in the vertical direction may be 60% or less of the thickness (e.g., B1) of the exit surface portion 35, for example, in the range of 40% to 60%, or in the range of 45% to 55%. The lower end position of the opening portion 65 may be arranged in a range of 80% or less of the height of the exit surface portion 35, for example, in the range of 70% to 80% or 72% to 78% of the height of the exit surface portion 35. Accordingly, the side surface of the light emitting device 21 may face the second portion 63B and may not face the opening portion 65. The lower end of the opening portion 65 may be disposed at a higher position than the upper surface of the light emitting device 21. The height of the lower end of the opening portion 65 is the height of the second portion 63B with respect to the upper surface of the circuit board 11, and may be 5 times or more, for example, in the range of 5 times to 10 times or 5 times to 7 times the thickness of the light emitting device 21. Accordingly, the amount of light directly emitted from the light emitting device 21 through the opening portion 65 may be reduced. The height of the second portion 63B may be in the range of 2 mm or more, for example, 2 mm to 3 mm.

Figure 5:
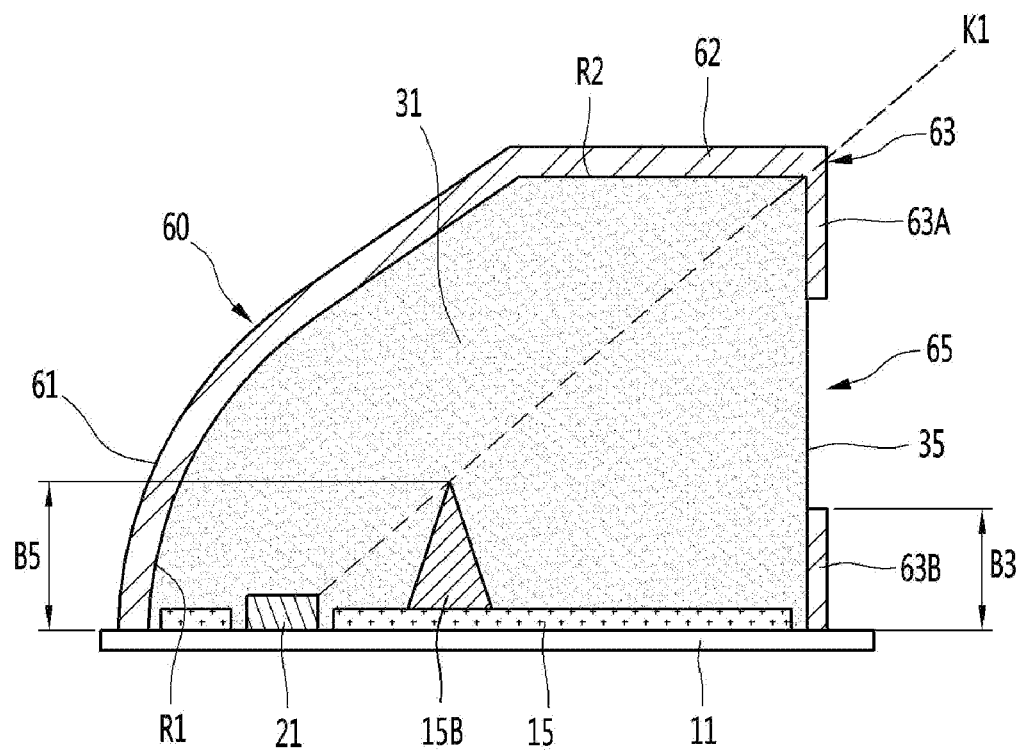
Figure 6:
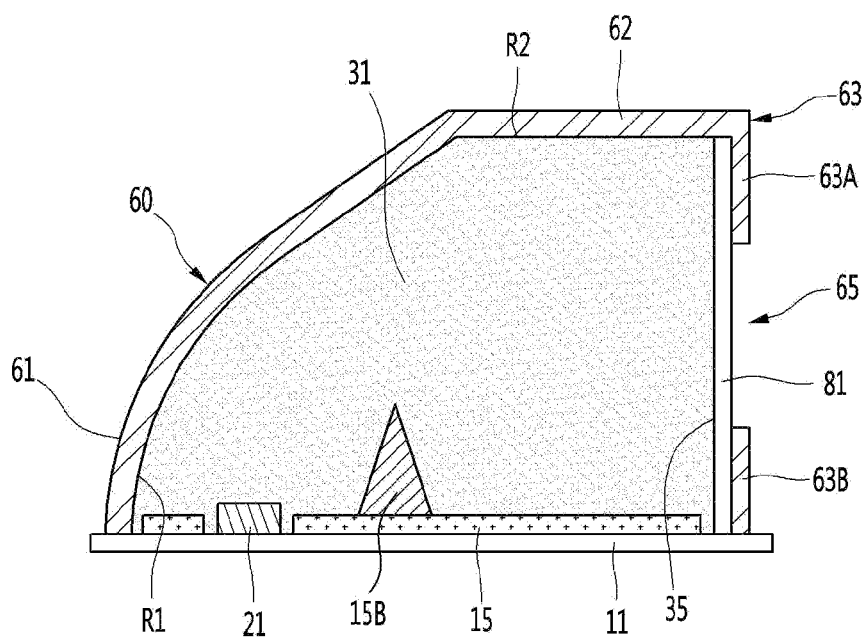

As shown in FIGS. 1 and 2, the third reflective portion 63 may include third portion 63C disposed on both side surfaces in the longitudinal direction of the exit surface portion 35 of the resin layer 31, The third portion 63C is connected to the first portion 63A and the second portion 63B, and the width of the third portion 63C may vary depending on the length of the opening portion 65. As shown in FIGS. 5 and 6, a reflector 15B may be formed in the resin layer 31. The reflector 15B may be disposed between the light emitting device 21 and the third reflective portion 63 of the reflective member 60. The reflector 15B may be disposed on the circuit board 11 or on the reflective layer 15. The reflector 15B may have a long length in one direction, and a lower surface thereof may be formed to have a wider width than an upper end. The reflector 15B may have a polygonal side cross-section, for example, a triangular shape, or a hemispherical shape. The distance G1 (refer to FIG. 3) between the center of the light emitting device 21 and the other end of the lower surface of the resin layer 31 may be the same as the distance to the reflector 15B. accordingly, the position of the light emitting device 21 may be disposed in the center between the lower end of the first reflective portion 61 of the reflective member 60 and the reflector 15B so that the distribution by the reflection efficiency of the light emitted from both sides of the light emitting device 21 is similar.

An upper end of the reflector 15B may vertically overlap with the first reflective portion 61 of the reflective member 60 or the curved surface portion R1 of the resin layer 31. The upper end of the reflector 15B may not vertically overlap with the second reflective portion 62 of the reflective member 60 or the upper surface R2 of the resin layer 31. An upper end of the reflector 15B may correspond to a position adjacent to a boundary portion between the first reflective portion 61 and the second reflective portion 62 of the reflector 60. A distance between the reflector 15B and the light emitting device 21 may be smaller than a distance between the exit surface portion 35 and the reflector 15B. Accordingly, light emitted toward one side of the light emitting device 21 may be effectively reflected, and light extraction efficiency or loss may be reduced. An upper end height B5 of the reflector 15B may be disposed higher than an upper surface of the light emitting device 21. An upper end of the reflector 15B may be disposed higher than a lower end of the opening portion 65. The upper end height B5 of the reflector 15B may be 50% or less of the maximum height B1 of the exit surface portion 35 and may be greater than or equal to the upper end height B3 of the second portion 63B. The upper end of the reflector 15B may be positioned on an imaginary straight line K1 passing through the light emitting device 21 and the upper end of the exit surface portion 35 of the resin layer 31, for example, the upper end of the reflector 15B may be disposed at a height of 100% to 120% with respect to the straight line K1. That is, the reflective region of the light may be set in consideration of the distribution of the beam angle of the light emitting device 21. Accordingly, the amount of light emitted from the light emitting device 21 directly emitted through the opening portion 65 may be minimized. As a first example, the reflector 15B may be disposed to cover the plurality of light emitting devices 21 in the structure of FIG. 2. The length of the reflector 15B may be shorter than the length of the resin layer 31 and greater than the distance between the outermost light emitting devices 21.

As a second example, a plurality of the reflectors 15B may be disposed in regions respectively corresponding to the light emitting devices 21. Each of the reflectors 15B may be disposed to be larger than the length of each light emitting device 21, for example, in a range of 120% to 250% of the length of each light emitting device 21. Accordingly, each of the reflectors 15B may effectively reflect the light emitted from each of the light emitting devices 21 facing each other. That is, the reflector 15B may be provided in a structure in which at least some of the regions between the respective light emitting devices 21 are opened.

The reflector 15B may be formed of a metal or non-metal material. The metal material may be formed of a material such as aluminum or silver. The non-metallic material may be provided as at least one of a resin material, a transparent PET, and a white polyethylene terephthalate (PET) material. The reflector 15B may include any one of $TiO_2$, $CaCO_3$, $BaSO_4$, $Al_2O_3$, Silicon, and PS inside a resin. Since the thickness of the reflector 15B becomes thinner toward the upper end thereof, the reflectance of light in the lower center of the reflector 15B may be 85% or more, for example, 90% or more, and the reflectance of light is 85% or less or the transmittance of light is 15% or more in the upper center of the reflector 15B. Such the reflector 15B may suppress a hot spot on the side surface of the light emitting device 21.

As shown in FIG. 6, a diffusion layer 81 may be disposed on the exit surface portion 35 of the resin layer 31. The diffusion layer 81 may be disposed on the entire exit surface portion 35 of the resin layer 31. The diffusion layer 81 may extend from an upper end to a lower end of the exit surface portion 35 of the resin layer 31. The diffusion layer 81 may be in contact with the exit surface portion 35 of the resin layer 31. The diffusion layer 81 may be in contact with the third reflective portion 63 of the reflective member 60. The diffusion layer 81 may be disposed between the exit surface portion 35 of the resin layer 31 and the third reflective portion 63 of the reflective member 60. The diffusion layer 81 may be disposed in the opening portion 65 disposed in the third reflective portion 63 of the reflective member 60. Accordingly, the light traveling through the opening portion 65 may be emitted after being diffused into the diffusion layer 81. As another example, the diffusion layer 81 may be disposed on the outer surface of the third reflective portion 63 of the reflective member 60 to cover the outside of the opening portion 65. The diffusion layer 81 may be in contact with inner sides of the first portion 63A, the second portion 63B, and the third portion 63C of the third reflective portion 63. The opening portion 65 of the third reflective portion 63 may be opened or exposed on the outer surface of the diffusion layer 81. As another example, the diffusion layer 81 is formed to correspond to the shape of the opening portion 65 of the third reflective portion 63, and the first portion 63A, the second portion 63B and the third portion 63C may be disposed in the opening portion 65.

The diffusion layer 81 may be formed of a resin material such as silicone or epoxy, thereby preventing deterioration of adhesion with the resin layer 31. The diffusion layer 81 may include a diffusion agent in a transparent resin material. The diffusion layer 81 may diffuse incident light. The diffusing agent may include at least one of a poly methyl meth acrylate (PMMA) series, $TiO_2$, $SiO_2$, $Al_2O_3$, and silicon series. The diffusion layer 81 may include at least one or two or more of a diffusion agent such as beads, a phosphor, and ink particles. An inner surface of the diffusion layer 81 may be in contact with the resin layer 31, and an outer surface of the diffusion layer 81 may be exposed to the outside. The diffusion layer 81 may include a single layer or multiple layers. The thickness of the diffusion layer 81 is a gap between the inner side and the outer side, and is 25 μm or more, and may be, for example, in the range of 25 μm to 250 μm or in the range of 100 μm to 250 μm. The diffusion layer 81 may have the above thickness range and provide incident light as uniform surface light. As another example, a micro-sized lens pattern may be formed on the inner surface and/or the outer surface of the diffusion layer 81. Accordingly, the diffusion layer 81 may improve the uniformity of the emitted light. The vertical length of the diffusion layer 81 may be equal to the length of the vertical surface of the exit surface portion 35 or greater than the vertical width of the opening portion 65. The horizontal length of the diffusion layer 81 may be equal to the horizontal length of the exit surface portion 35 or greater than the horizontal length of the opening portion 65. Here, as another example of the invention, a phosphor layer (not shown) may be disposed between the reflective member 60 and the resin layer 31. The phosphor layer may convert a wavelength of incident light. The phosphor layer may include at least one of blue, green, yellow, and red phosphors. The phosphor layer may be disposed on the curved surface portion R1 of the resin layer 31 or may be disposed on the curved surface portion R1 and the upper surface portion.

Second Embodiment

FIGS. 7 to 12 are views illustrating a lighting module or a lighting device according to a second embodiment. In FIGS. 7 to 12, the same configuration as that of the first embodiment will be referred to with reference to the description of the first embodiment, and may be selectively applied to the second embodiment.

Figure 7:
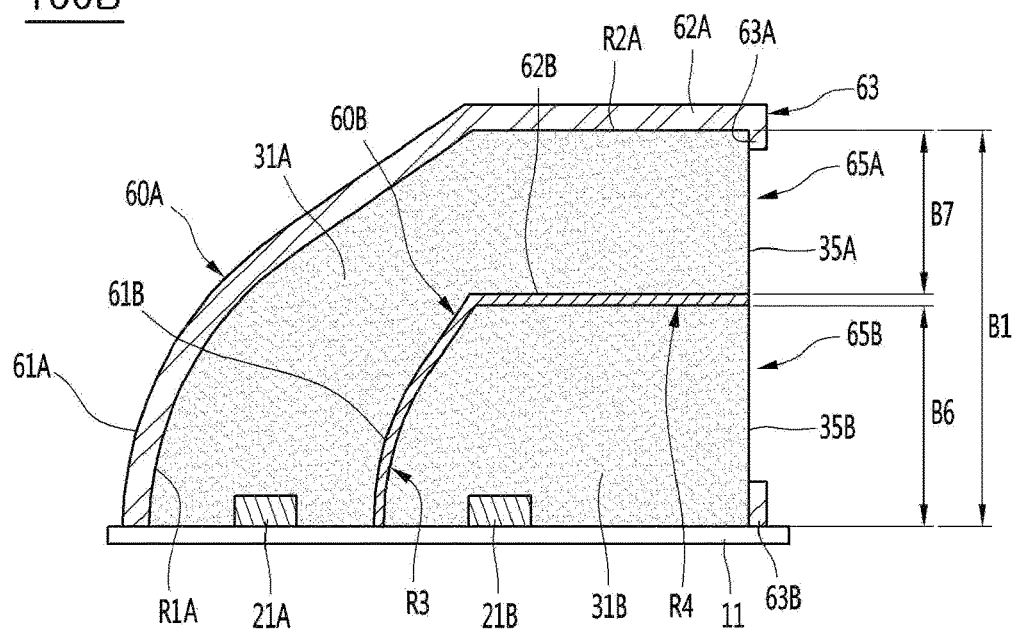
FIG. 7 is a side cross-sectional view of a lighting module according to a second embodiment of the invention.
Figure 8:
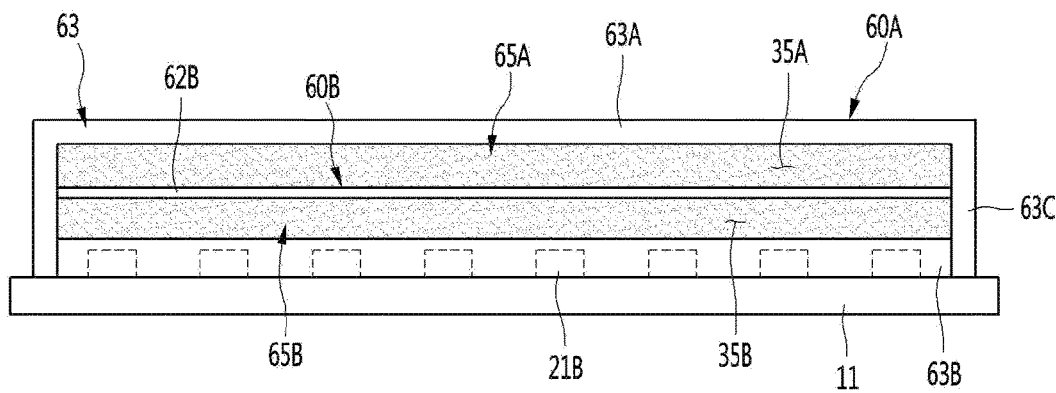
FIG. 8 is an example of a front view of the lighting module of FIG. 7.
Figure 9:
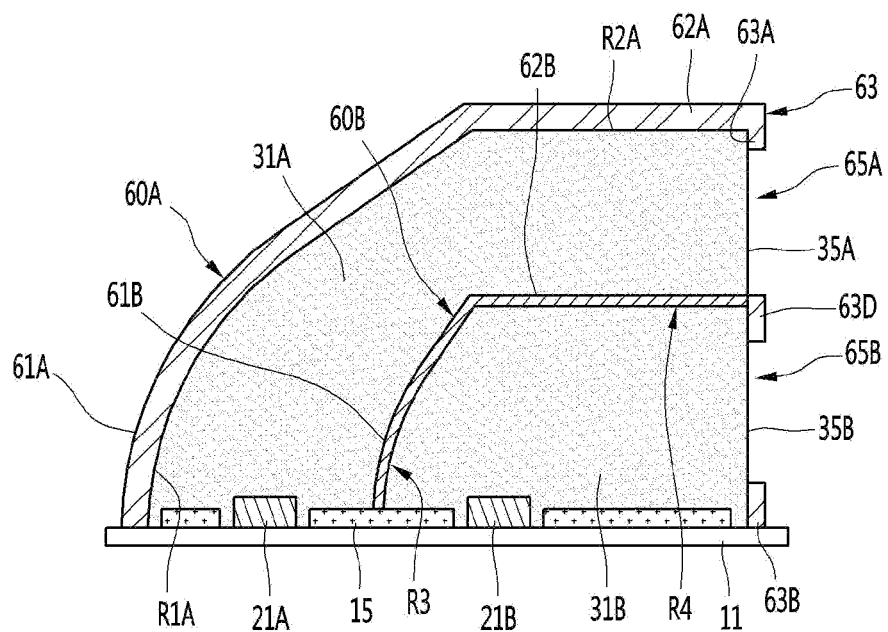
FIGS. 9 to 11 are modified examples of the lighting module of 7.

Referring to FIGS. 7 and 8, the lighting module 100B includes a circuit board 11, a resin layer having a first resin portion 31A and a second resin portion 31B on the circuit board 11, a reflective member having a first reflective member 60A and a second reflective member 60B, and a light emitting portion having first and second light emitting devices 21A and 21B on the circuit board 11. The reflective layer 15 is disposed on the circuit board 11 and may be disposed under the first and second resin portions 31A and 31B. The first resin portion 31A may include a first curved surface portion R1A, a first upper surface portion R2A, and a first exit surface portion 35A. The second resin portion 31B may include a second curved surface part R3, a second upper surface portion R4, and a second exit surface portion 35B. The first reflective member 60A may include a first reflective portion 61A disposed on the first curved surface portion R1A of the first resin portion 31A, and a second reflective portion 62A disposed on the first upper surface portion R2A. The second reflective member 60B may include a fourth reflective portion 61B disposed on the second curved surface portion R3 of the second resin portion 31B, and a fifth reflective portion 62B disposed on a second upper surface portion R4 of the second resin portion 31B. The first light emitting device 21A is disposed in a first row on the circuit board 11 and is sealed in a first resin portion 31A, and the second light emitting device 21B may be disposed in a second row in front of the first row on the circuit board 11 and may be sealed in the second resin portion 31B. A plurality of the first light emitting devices 21A are disposed along the longitudinal direction of the circuit board 11, and may be disposed between the first reflective portion 61A of the first reflective member 60A and a second reflecting member 61B of the second reflective member 60B. The center of the first light emitting device 21A may be spaced apart from the first reflective portion 61A and the fourth reflective portion 61B by the same distance. A plurality of the second light emitting devices 21B are disposed along the longitudinal direction of the circuit board 11, and may be disposed between a fourth reflective portion 61B of the second reflective member 60B and a second exit surface portions 35B of the second resin portion 31B. The distance between the second light emitting device 21B and the fourth reflective portion 61B of the second reflecting member 60B may be smaller than the distance between the second light emitting device 21B and the second exit surface portion 35B.

Here, the first and second reflective members 60A and 60B may include a third reflective portion 63 (63, 63B, 63C, see FIG. 8) disposed on at least a portion of the upper portion, lower portion, or both outer sides of the first and second exit surface portions 35A and 35B. The second reflective member 60B may be disposed between the first resin portion 31A and the second resin portion 31B. The first and second reflective members 60A and 60B may be connected to each other by the third reflective portion 63, and the first and second reflective members 60A and 60B or the third reflective portion 63 may include a first opening portion 65A in which the first exit surface portion 35A of the first resin portion 31A is opened and a second opening portion 65B in which the second exit surface portion 35B of the second resin portion 31B is opened. The first opening portion 65A may be disposed on the second resin portion 31B. The first opening portion 65A may be disposed outside between the second reflective portion 62A of the first reflective member 60A and the fifth reflective portion 62B of the second reflective member 60B. The first opening portion 65A may be disposed above the second opening portion 65B, and the second opening portion 65B may be disposed lower than the first opening portion 65A. The first exit surface portion 35A or the first opening portion 65A may be disposed outside between the second reflective portion 62A of the first reflective member 60A and the fifth reflective portion 62B of the second reflective member 60B. The second exit surface portion 35B or the second opening portion 65B may be disposed outside between the second reflective portion 62B of the second reflective member 60B and the circuit board 11 or the reflective layer 15.

The first exit surface portion 35A of the first resin portion 31A and the second exit surface portion 35B of the second resin portion 31B may be disposed on the same vertical plane. As another example, the first exit surface portion 35A may be provided as a vertical or inclined surface, and the second exit surface portion 35B may be provided as a vertical or inclined surface. Here, the inclined surfaces of the first and second exit surface portions 35A and 35B may be flat in which the upper end of the first exit surface portion 35A or the second exit surface portion 35B protrude outward than the lower end, or the lower end of the first exit surface portion 35A or the second exit surface portion 35B protrudes outward than the upper end. The third reflective portion 63 may include a first portion 63A on the first exit surface portion 35A, a second portion 63B on the second exit surface portion 35B, and a third portion 63C (refer to FIG. 8) on the both outsides, and may expose the first opening portion 65A and the second opening portion 65B. The height of the upper end of the second portion 63B of the third reflective portion 63 may be higher than the height of the upper surfaces of the first and second light emitting devices 21A and 21B. Accordingly, the amount of light directly emitted through the second exit surface portion 35B through the side surface of the second light emitting device 21B may be reduced.

The first curved surface portion R1A of the first resin portion 31A is disposed outside the first light emitting device 21A, and the lower region of the first curved surface portion R1A may face the second curved surface portion R3, and the upper region may face the first exit surface portion 35A. The lower region of the first curved surface portion R1A of the first resin portion 31A may have the same curvature as that of the second curved surface portion R3 of the second resin portion 31B. Since the lower region of the first curved surface portion R1A and the second curved surface portion R3 have the same curvature, the reflection characteristics of the light emitted from the first and second light emitting devices 21A and 21B may be uniformed.

The first resin portion 31A extends upwardly from the rear of the second resin portion 31B, and may emit the light emitted from the first light emitting device 21A through the first exit surface portion 35A. The second resin portion 31B may be disposed in front of the first resin portion 31A and may emit light emitted from the second light emitting device 21B through the second exit surface portion 35B. The second light emitting device 21B may vertically overlap a portion of the second curved surface portion R3 of the second resin portion 31B. Alternatively, the second light emitting device 21B may vertically overlap with a portion of the second curved surface portion R3 of the second resin portion 31B and/or the second upper surface portion R4. The first and second light emitting devices 21A and 21B may be driven separately from each other or may be driven identically. A vertical width B7 of the first exit surface portion 35A is the same as a vertical width B6 of the second exit surface portion 35B, or may be in the range of 50% to 100% of a vertical width B6 of the second exit surface portion 35B. The width B7 in the vertical direction of the first opening portion 65A is equal to the width B6 in the vertical direction of the second opening portion 65B, or may be in in the range of 50% to 100% of the width of the second opening portion 65B. Accordingly, the exit area through which the light is emitted can be adjusted through the sizes of the first and second opening portions 65A and 65B. Here, the height B1 from the upper surface of the circuit board 11 to the first upper surface portion R2A of the first resin portion 31A may be 8 mm or more, for example, in the range of 8 mm to 15 mm or in the range of 8 mm to 13 mm. Accordingly, each of the widths B6 and B7 may be provided in a range of 3 mm or more, for example, 3 mm to 7 mm.

As a first modified example of the invention, a first phosphor layer (not shown) may be disposed between the first reflective member 60A and the first resin portion 31A. The first phosphor layer may convert a wavelength of incident light. The first phosphor layer may include at least one of blue, green, yellow, and red phosphors. The first phosphor layer may be disposed on the first curved surface portion R1A of the first resin portion 31A, or may be disposed on the first curved surface portion R1A and the first upper surface portion R2A.

As a second modified example of the invention, a second phosphor layer (not shown) may be disposed between the second reflective member 60B and the second resin portion 31B. The second phosphor layer may convert a wavelength of incident light. The second phosphor layer may include at least one of blue, green, yellow, and red phosphors. The second phosphor layer may be disposed on the second curved surface portion R3 of the second resin portion 31B or on the second curved surface portion R3 and the second upper surface portion R4.

The third modified example of the invention may include both the first phosphor layer and the second phosphor layer disclosed above. For example, a first phosphor layer may be disposed on the first curved surface portion R1A and/or the first upper surface portion R2A of the first resin portion 31A, and the second phosphor layer may be disposed on the second curved surface portion R3 and/or the second upper surface portion R4 of the second resin portion 31B. In addition, the phosphors added to the first and second phosphor layers may be the same as or different from each other.

The first light emitting device 21A and the second light emitting device 21B may emit light of the same color wavelength or may emit light of different color wavelengths. The number of the first and second light emitting devices 21A and 21B may be the same or different from each other. For example, the number of the first light emitting devices 21A may be greater than the number of the second light emitting devices 21B. The number of devices of the light emitting portion may be provided as required according to the luminous intensity characteristics of the lamp.

Figure 10:
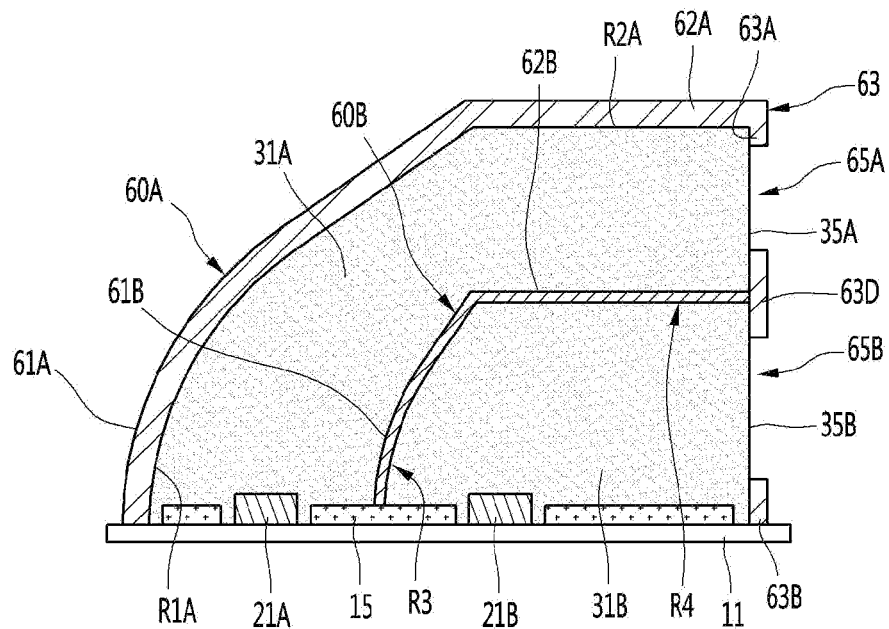
Figure 11:
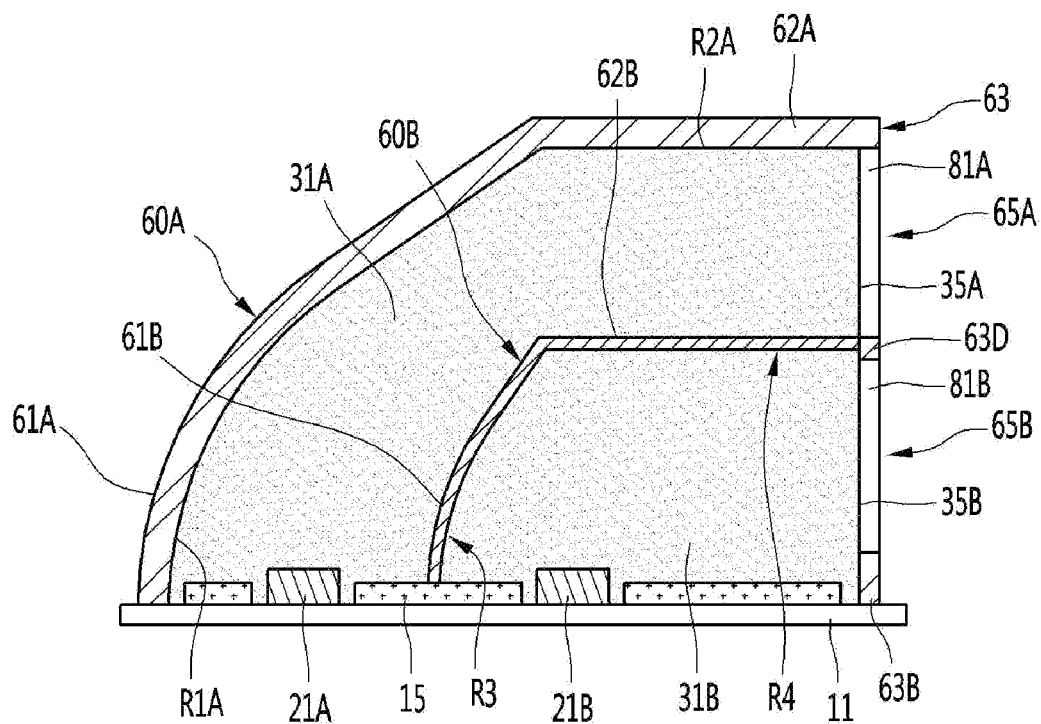

As shown in FIG. 10, in the lighting module, the third reflective portion 63 of the reflective member may include a fourth portion 63D disposed on the lower portion of the first exit surface portion 35A of the first resin portion 31A and an upper portion of the second exit surface portion 35B of the second resin portion 31B. The fourth portion 63D of the third reflective portion 63 may be in contact with one end of the fifth reflective portion 62B of the second reflective member 60B. The fourth portion 63D of the third reflective portion 63 may be disposed to horizontally overlap the first and second exit surface portions 35A and 35B. Accordingly, the size of the first and second opening portions 65A and 65B may be adjusted by the third reflecting unit 63. As shown in FIG. 11, the fourth portion 63D of the third reflective portion 63 may be disposed below the first exit surface portion 35A or above the second exit surface portion 35B.

As shown in FIG. 11, a diffusion layer 81A and 81B may be disposed on at least one or both of the first and second exit surface portions 35A and 35B. The diffusion layer 81A and 81B may include, for example, a first diffusion layer 81A disposed on the first exit surface portion 35A, and a second diffusion layer 81B disposed on the second exit surface portion 35B. The first diffusion layer 81A and the second diffusion layer 81B may be separated from each other by the fourth portion 63D of the third reflective portion 63. The fourth portion 63D of the third reflective portion 63 may be disposed between the first diffusion layer 81A and the second diffusion layer 81B to block optical interference. The first diffusion layer 81A may be in contact with the surface of the first exit surface portion 35A to diffuse the light emitted from the first light emitting device 21A. The second diffusion layer 81B may be in contact with the surface of the second exit surface portion 35B to diffuse the light emitted from the second light emitting device 21B.

Here, the first diffusion layer 81A is formed on the entire surface of the first exit surface portion 35A of the first resin portion 31A, or may be disposed inside the third reflective portion 63 excluding the first opening portion 65A. The second diffusion layer 81B may be formed on the entire surface of the second exit surface portion 35B of the second resin portion 31B, or disposed inside the third reflective portion 63 except for the second opening portion 65B.

Figure 12:
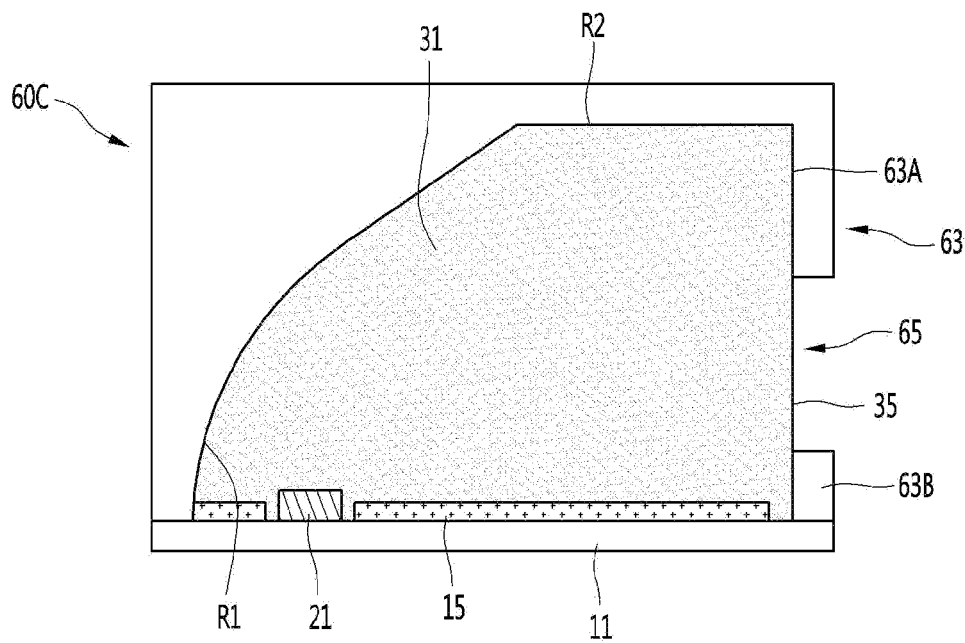
FIG. 12 is an example of a lighting module having a reflective member of another example according to an embodiment of the invention.

As shown in FIG. 12, the lighting module may be provided as a housing 60C having a predetermined shape with respect to the reflective member. The housing 60C may cover the curved surface portion R1 and the upper surface portion R2 of the resin layer 31 on the circuit board 11, and may have a third reflective portion 63 and function as a reflective member. The first portion 63A and the second portion 63B of the third reflective portion 63 may extend to the exit surface portion 35 except for the opening portion 65. The housing 60C may be formed of a reflective plastic material or a metal material.

Figure 13:
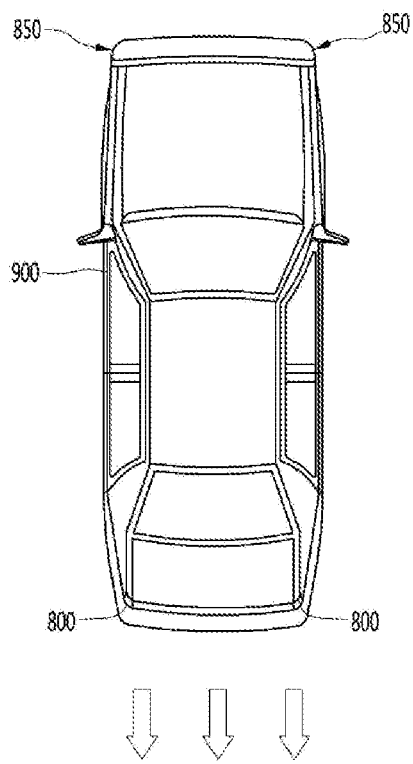
FIG. 13 is a plan view of a vehicle to which a lamp having a lighting module according to an embodiment of the invention is applied.
Figure 14:
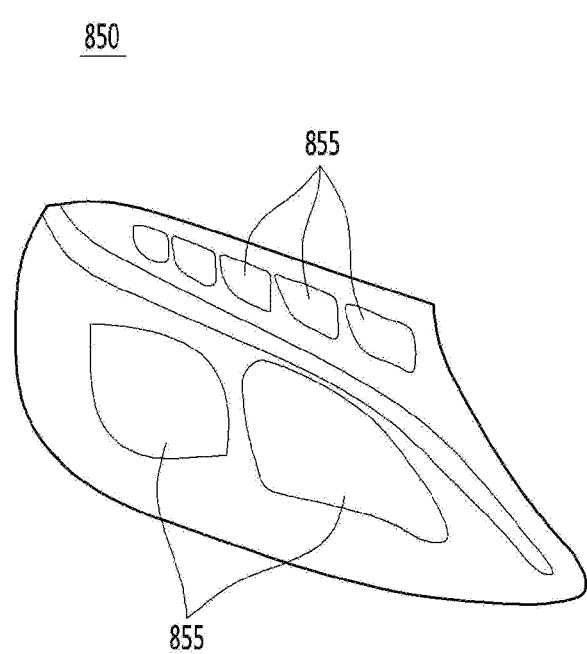
FIG. 14 is an example of a front lighting device of a vehicle according to an embodiment of the invention.
Figure 15:
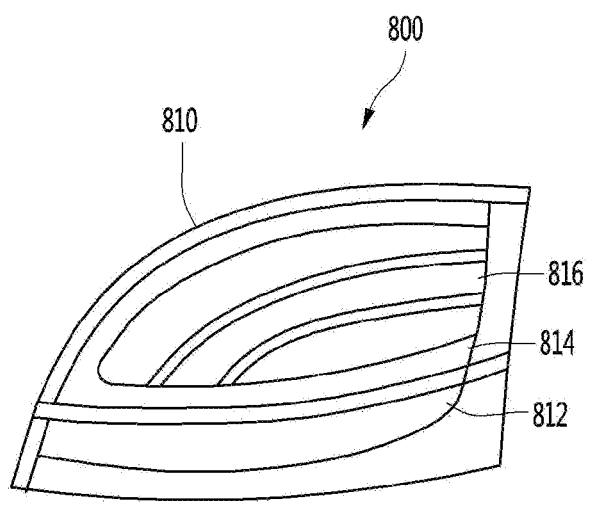
FIG. 15 is a view showing an example of a rear lighting device of a vehicle according to an embodiment of the invention.

FIG. 13 is a plan view of a vehicle to which a lamp having a lighting module according to an embodiment is applied, FIG. 14 is a view showing an example of a front lamp in the vehicle of FIG. 13, and FIG. 15 is a view showing a tail light of the vehicle of FIG. 13. Referring to FIGS. 13 to 15, in the vehicle 900, a front lamp 850 may include one or more lighting modules 855, and individually control the driving timing of these lighting modules 855 to function as a normal headlight as well as a welcome when the driver opens the vehicle door, and it may also provide additional functions, such as a light or a celebration effect. The lamp may be applied to a daytime running lamp, a high beam, a low beam, a fog lamp or a turn signal lamp.

In addition, the tail lamp 800 of the vehicle 900 may include a first lamp unit 812, a second lamp unit 814, a third lamp unit 816, and a housing 810. Here, the first lamp unit 812 may be a lighting module serving as a turn indicator, the second lamp unit 814 may be a lighting module serving as a sidelight, and the third lamp unit 816 may be a lighting module serving as a brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention. In addition, although the embodiment has been described above, it is merely an example and does not limit the invention, and those of ordinary skill in the art to which the invention pertains are exemplified above in a range that does not depart from the essential characteristics of the present embodiment. It can be seen that various modifications and applications that have not been made are possible. For example, each component specifically shown in the embodiment can be implemented by modification. And differences related to such modifications and applications should be construed as being included in the scope of the invention defined in the appended claims.

The invention claimed is:

1. A lighting module comprising:
a circuit board;
a plurality of light emitting devices arranged in a first direction on the circuit board;
a resin layer sealing the plurality of light emitting devices; and
a reflective member disposed on a surface of the resin layer and having an opening portion on one side,
wherein the resin layer include: an exit surface portion in which the opening portion is disposed; a curved surface portion opposite to the exit surface portion; and an upper surface portion disposed on the curved surface portion and the exit surface portion,
wherein the plurality of light emitting devices overlaps the curved surface portion in a vertical direction,
wherein the plurality of light emitting devices is horizontally overlapped with a portion of the reflective member disposed on the exit surface portion,
wherein the upper surface portion of the resin layer has a horizontal plane,
wherein a width in a vertical direction of the opening portion is smaller than a height in the vertical direction of the exit surface portion,
wherein the plurality of light emitting devices is disposed closer to a lower end of the curved surface portion than a lower end of the exit surface portion,
wherein the reflective member includes a first portion extending on an upper portion of the exit surface portion and a second portion disposed on a lower portion of the exit surface portion,
wherein the opening portion is disposed between the first portion and the second portion,
wherein a side surface of each of the plurality of light emitting devices faces the second portion, and
wherein a lower end position of the opening portion is disposed at a higher position than an upper surface of each of the light emitting devices.

2. The lighting module of claim 1, wherein the reflective member includes a first reflective portion disposed on the curved surface portion of the resin layer, a second reflective portion disposed on the upper surface portion, and a third reflective portion disposed on the exit surface portion and having the opening portion, and
wherein the third reflective portion has the first portion and the second portion.

3. The lighting module of claim 2,
wherein an upper end of the second portion of the third reflective portion is disposed higher than an upper end of each of the light emitting devices.

4. The lighting module of claim 2, wherein the curved surface portion or the first reflective portion has a parabolic shape.

5. The lighting module of claim 1, comprising a reflective layer between the resin layer and the circuit board.

6. The lighting module of claim 1, comprising a diffusion layer disposed on the exit surface portion, and
wherein the diffusion layer is in contact with inner sides of the first portion and the second portion.

7. The lighting module of claim 1, comprising a reflective layer disposed between the resin layer and the circuit board, and a reflector disposed between the light emitting devices and the exit surface portion, and
wherein an upper end height of the reflector is higher than an upper surface of each of the light emitting devices and is 50% or less of a maximum thickness of the resin layer.

8. The lighting module of to claim 7, wherein a distance between the exit surface portion and each of the light emitting devices is greater than a distance between the reflector and each of the light emitting devices, and wherein a height of the reflector is equal to or greater than a height of an upper end of the second portion.

9. A lighting module comprising:
a circuit board;
a plurality of light emitting devices arranged in a first direction on the circuit board;
a resin layer sealing the plurality of light emitting devices; and
a reflective member disposed on a surface of the resin layer and having an opening portion on one side,
wherein the plurality of light emitting device s includes a plurality of first light emitting devices arranged in a first row, and a plurality of second light emitting devices arranged in a second row,
wherein the resin layer includes a first resin portion sealing the first light emitting devices and providing a first exit surface portion, and a second resin portion sealing the second light emitting devices and providing a second exit surface portion, and
wherein the reflective member includes a first reflective member having a first opening portion on the first exit surface portion and disposed on the first resin portion, and a second reflective member disposed between the first and second resin portions and having a second opening portion on the second exit surface portion.

10. The lighting module of claim 9, wherein the first resin portion comprises a first curved surface portion opposite to the second exit surface portion, and a first upper surface portion disposed on the first curved surface portion and the first exit surface portion,
wherein the second resin portion includes a second curved surface portion opposite to the second exit surface portion, and a second upper surface portion disposed on the second curved surface portion and the second exit surface portion, and
wherein a portion of the reflective member is disposed on at least a portion of the first exit surface portion and the second exit surface portion.

11. The lighting module of claim 10, wherein the first light emitting device overlaps the first curved surface portion in a vertical direction,
wherein the first and second upper surface portions have a horizontal plane, and
wherein the first light emitting devices, is disposed closer to a lower end of the first curved surface portion than a lower end of the first exit surface portion.

12. The lighting module of claim 9, wherein the second exit surface portion is disposed on an upper portion of the first exit surface portion.

13. The lighting module of claim 12, comprising a diffusion layer disposed on at least one of the first and second exit surface portions.

14. The lighting module of claim 10, wherein the first curved portion is disposed outside the plurality of first light emitting devices,
wherein each of the second light emitting devices vertically overlaps with a portion of the second curved portion of the second resin portion.

15. The lighting module of claim 9, wherein the second resin portion is disposed in front of the first resin portion, and
wherein the first resin portion extends upward from a rear of the second resin portion.

16. The lighting module of claim 15, wherein the second opening portion is disposed lower than the first opening portion.

17. The lighting module of claim 9, wherein the first reflective member comprises a first portion disposed on an upper portion of the first exit surface portion and a second portion disposed a lower portion of the second exit surface portion, and
wherein an upper end height of the second portion is disposed higher than an upper end height of the first and second light emitting devices.

18. The lighting module of claim 1, further comprising a reflective layer between the resin layer and the circuit board, and a reflector disposed between the plurality of light emitting devices and the exit surface portion, and
wherein an upper end of the reflector is disposed at a height of 100% to 120% based on an imaginary straight line passing through the light emitting devices and an upper end of the exit surface portion of the resin layer.

19. The lighting module of claim 1, comprising a reflector disposed between the plurality of light emitting devices and the exit surface portion,
wherein a length of the reflector is shorter than a length of the resin layer and greater than a distance between outermost light emitting devices.

20. The lighting module of claim 1, comprising a reflector disposed between the plurality of light emitting devices and the exit surface portion,
wherein the upper end of the reflector is vertically overlapped with the first reflective portion of the reflective member, and
wherein the reflector has a long length in one direction, and has a lower surface having a wider width than an upper end of the reflector.

* * * * *